March 10, 1964 R. C. HEYSER 3,124,757

BALANCED TRANSISTOR POWER AMPLIFIER CONNECTED IN A BRIDGE CONFIGURATION

Original Filed Oct. 21, 1957 2 Sheets-Sheet 1

INVENTOR.
RICHARD C. HEYSER
BY Lyon & Lyon
ATTORNEYS

March 10, 1964 R. C. HEYSER 3,124,757
BALANCED TRANSISTOR POWER AMPLIFIER CONNECTED
IN A BRIDGE CONFIGURATION
Original Filed Oct. 21, 1957 2 Sheets-Sheet 2

INVENTOR.
RICHARD C HEYSER
BY Lyon & Lyon
ATTORNEYS

United States Patent Office 3,124,757

Patented Mar. 10, 1964

3,124,757

BALANCED TRANSISTOR POWER AMPLIFIER CONNECTED IN A BRIDGE CONFIGURATION

Richard C. Heyser, La Canada, Calif., assignor to California Institute Research Foundation, a corporation of California Original application Oct. 21, 1957, Ser. No. 691,254. Divided and this application Dec. 29, 1960, Ser. No. 79,467

4 Claims. (Cl. 330—17)

This application is a division of application Ser. No. 691,254 filed October 21, 1957 for Transistor Amplifier, now abandoned.

This invention relates to transistor amplifiers and, more particularly, to improvements therein.

An object of the present invention is to provide a novel transistor power amplifier.

Another object of the present invention is to provide a high-efficiency transistor power amplifier.

Yet another object of the present invention is the provision of a compact transistor power amplifier which has characteristics comparable with those of quality vacuum-tube amplifiers.

These and other objects of the invention are achieved by employing four transistors which are arranged in a bridge configuration such that a load may be driven anti-symmetrically by a push-pull input signal. Two of the transistors are load-driving transistors, and their emitters are coupled to either side of the load. A push-pull driving signal is applied to their bases. The remaining two transistors, which will be designated as the current-source transistors, are coupled to the load-driving transistors to insure that they will remain in conduction at all times. As a result, the power amplifier operates substantially as a class AB amplifier. In response to the driving signal current may be drawn through the load from a current source transistor through the load to the load-driving transistor on the opposite end of the load.

The novel features that are considered characteristic of this invention are set forth with particularity in the appended claims. The invention itself, both as to its organization and method of operation as well as additional objects and advantages thereof, will better be understood from the following description when read in connection with the accompanying drawings in which:

Figure 1:
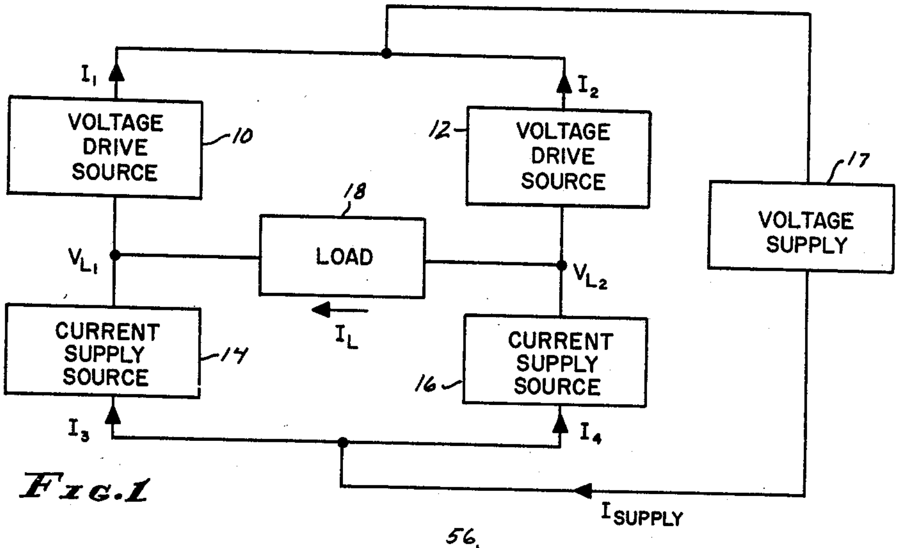
FIGURE 1 is a block diagram of the basic features of the invention.

Referring now to FIGURE 1, there may be seen a block diagram of the basic configuration of this invention. This includes two voltage drive sources 10, 12 and two current supply sources 14, 16 connected in a bridge configuration with a load 18 connected across the diagonal of the bridge. It is assumed that the voltage sources are to be operated in a linear mode and hence the current through them should not drop below a critical quiescent value denoted by $I_Q$, although under signal conditions full load current may be drawn through them. Under signal conditions a load current must be provided which is equal to the quotient of the potential difference across the load to the value of the load impedance.

Figure 2:
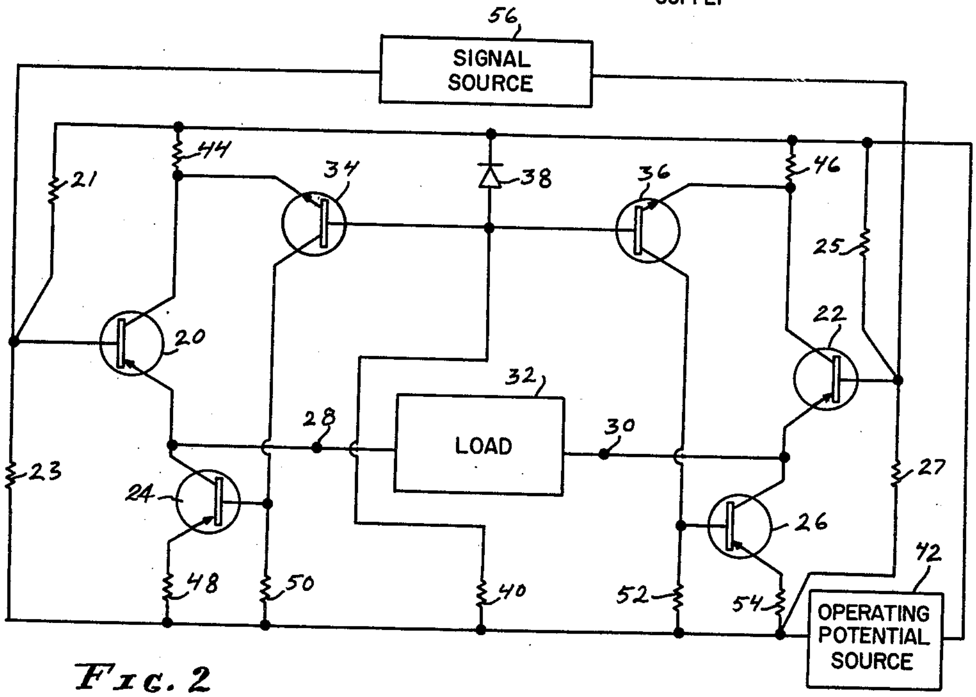
FIGURE 2 is a circuit diagram of one embodiment of the invention employed as a power amplifier.
Figure 3:
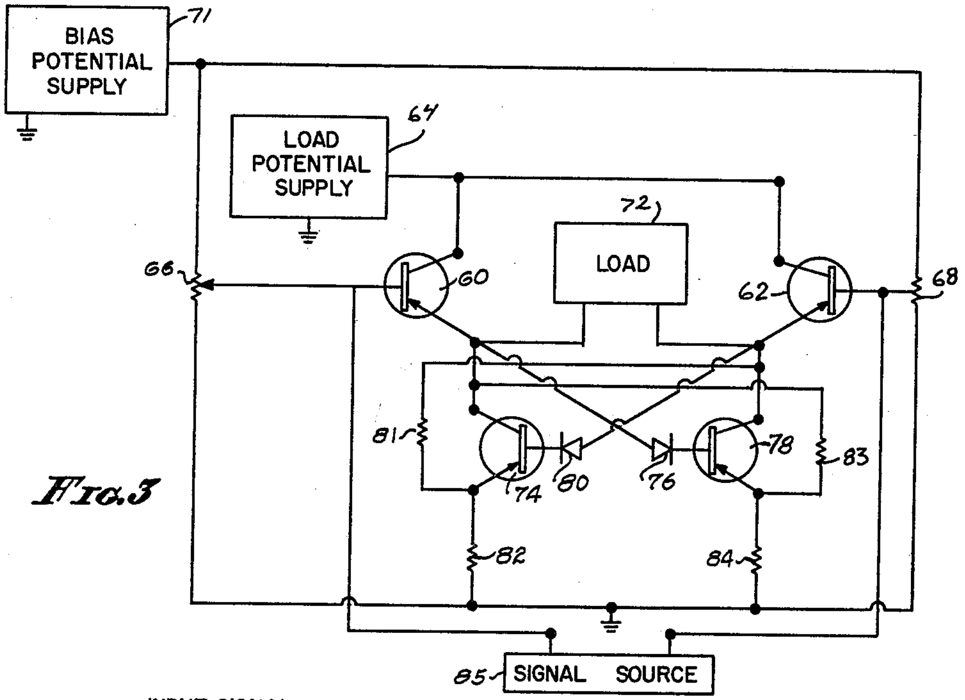
FIGURE 3 is a circuit diagram of the basic features of another embodiment of the invention.
Figure 4:
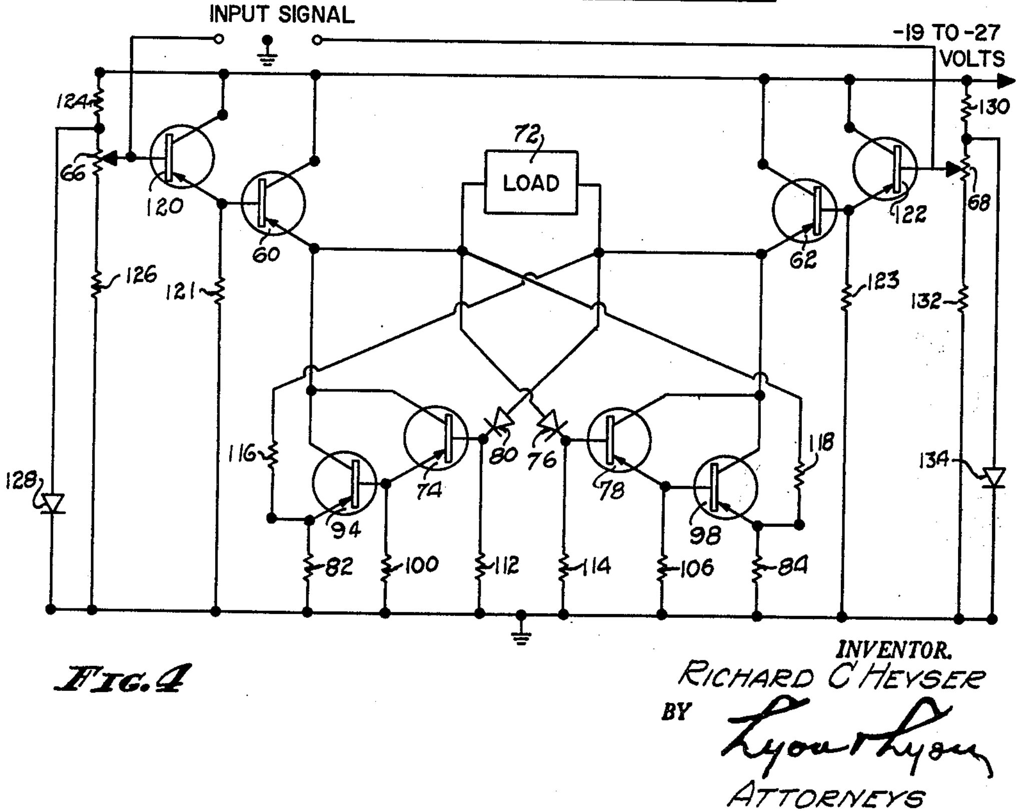
FIGURE 4 is a circuit diagram of the second embodiment of the invention used as a power amplifier.

Two techniques may be employed for obtaining this relationship. In one of these the magnitude of the current drives $I_3$, $I_4$ are so controlled that no time does $I_1$ or $I_2$ respectively fall below the quiescent value $I_Q$. In the other technique, the magnitudes of the current drives are controlled by the potentials across the load. FIGURE 2 illustrates a circuit for carrying out the first technique and FIGURES 3 and 4 illustrate a circuit for carrying out the second technique.

Referring now to FIGURE 2, there are shown a first and second load driving transistor 20, 22, corresponding to the voltage drive sources 10, 12. There is also shown a first and second current source transistor 24, 26 respectively corresponding to the current supply sources 14, 16. Two resistors 21, 23 are connected in series across the operating potential source 42. The base of load driving transistor 20 is connected to the junction of these two resistors. Two other resistors 25, 27 are connected in series across the operating potential 42. The base of load driving transistor 22 is connected to the junction of these two resistors. The emitters of the load driving transistors are respectively connected to the collectors of the current driving transistors 24, 26. These junctions are also respectively connected to a first and second load terminal to which a load 32, such as a loud speaker voice coil may be connected.

First and second bias transistors 34, 36 respectively have their emitters connected to the collectors of the first and second load driving transistors and their collectors connected to the bases of the first and second current supply transistors. The junction of a diode 38 and a resistor 40 connected in series is connected to the bases of the first and second bias transistors. The diode and resistor are connected across the output of a source of operating potential 42. A first and second resistor 44, 46 respectively connect the collectors of the first and second load-driving transistors to one side of the operating potential source. Third and fourth resistors 48, 54 respectively connect the emitters of the first and second current source transistors to the other side of source of operating potential. Fifth and sixth resistors 52, 50 respectively connect the bases of the first and second current source transistors to this side of the source of operating potential. Signals are applied from a signal source 56 to the bases of the load driving transistors, 20, 22.

When no signal is applied to the bases of the transistors 20 and 22, there will be some collector current flowing in each which, in passing through the first and second resistors 44, 46 establish potential drops which are respectively applied to the emitters of the first and second bias transistors. The bias potential established at the bases of these bias transistors by the current through the diode 38 is on the order of 0.15 volt. Thus the bias transistors are respectively enabled to draw enough collector current through the resistors 50, 52 to apply a bias to the bases of the current source transistors 24, 26 to enable them to supply the quiescent current required by the load driving transistors 20, 22. Note that the bias transistors are of a type opposite to the type of the other transistors (NPN where others are PNP). Since the bias transistors need only supply the quiescent base current of the current-source transistors they may be small signal transistors.

Regulation of the quiescent current is automatic. Should the collector current drawn through the first and second resistors change for some reason the bias transistors respond in a manner opposite to the change thereby driving the current source transistors to oppose the change. The quiescent current value is set by the parameters of the circuit including the values selected for the first and second resistors and the value of the bias applied to the bases of the bias transistors.

Upon the application of a signal from the source 56, the bases of the load driving transistors are driven out of phase. If the signal swing is such that current should be drawn through the load from terminal 30 to terminal 28, then the signal current is carried by the load driving transistor 20.

As a result the $I_R$ drop across the first resistor due to the vastly increased collector current cuts off transistor 34 and thereby transistor 24. The required load current is drawn from load current source transistor 26. Bias transistor 36 insures that in addition to load current the quiescent current for load driven transistor 22 is provided. On alternate half cycles the roles of transistors 24 and 26 are interchanged.

It is thus seen that for the circuitry described at least a quiescent current is provided at all times and the quiescent current in the load current supply transistors is established in response to the quiescent current passing through the load driver transistors. In response to driving signals a load driver transistor derives current from the load current source transistor connected to the opposite side of the load.

If the load be reactive and of such a nature that a load current must flow even though the potentials across the load are not in phase with this current then the bias transistors will assure this conduction. In the absence of a load the quiescent current is still maintained. If the load is shorted then the maximum current which will flow is determined by the output impedance of the load driving transistors.

Reference is now made to FIGURE 3 which shows the basic features of a circuit for controlling the current drives by the potentials across the load. This arrangement includes a pair of load-driving transistors 60, 62 having their collectors connected to a load supply potential source 64. The base of each of the load driving transistors is respectively connected to a bias-adjusting potentiometer 66, 68. Both of these bias-adjusting potentiometers are connected across a bias potential supply 71. The emitters of the respective load-driving transistors 60, 62 are connected on either side of a load 72. The emitter of load-driving transistor 60 is connected to the collector of a first current source transistor 74 and through a "Zener" diode 76 to the base of a second current-source transistor 78. The emitter of the second load-driving transistor 62 is connected to the collector of the second-current source transistor 78 and also through a Zener diode 80 to the base of the first current-source transistor 74. The emitter of current-source transistor 74 is connected through a resistor 82 to ground. The emitter of current-source transistor 78 is connected through a resistor 84 to ground. Push-pull driving signals are applied to the bases of the two load-driving transistors from signal source 85.

The current-source transistors 74, 78 serve to sustain a sufficient current drive through the load-driving transistors 60, 62 and through the load such that the load-driving transistors 60 and 62 at all times and under all signal application conditions remain in conduction. This requires that the magnitude of the impedance of resistors 82, 84 must be equal to or less than one-half of the magnitude of the load impedance. The Zener diodes are commercially purchasable silicon diodes which present a high reverse resistance until the voltage applied across them exceeds a predetermined value. They then present a low reverse resistance. The value of the quiescent current which is drawn through the load-driving transistors is established by the bias adjustments made at potentiometers 66 and 68, respectively. Since, in order to obtain power, the load-driving transistors are selected to be power transistors, the adjustments of potentiometers 66 and 68 once made are substantially independent of transistor variations because of the large-emitter mutual conductance of power transistors, which requires a very small emitter-to-base potential variation for large-emitter current variation. The mode of operation is thus selected by the bias adjustment.

At "no-driving-signal" conditions, each Zener diode has its maximum resistance value, since the voltage across it is less than its breakdown value (about 14.5 volts). Thus, very little base current can flow through the current-source transistors, and, therefore, the current flowing through each load-driver transistor and through the current-source transistors through the respective resistors 82, 84 to ground is a very small value determined by the setting of potentiometers 66, 68, the values of resistors 82, 84, and the high resistance values of the Zener diodes.

When driving signals are applied to the load-driver transistors, the negative voltage outputs at their emitters will be large enough to cause the Zener diodes to assume their low resistance values. At this time, the current-source transistors can provide large values of current, where this is required, by large input signal values which would otherwise drive the load-driver transistors into current cutoff.

Heretofore, to maintain the load-driver transistors in a current conduction condition to handle large input value signals, passive-resistive elements were used in place of the current-source transistors, and it was necessary to maintain a fairly large value of quiescent current. This, of course, is inefficient, since the current drawn through the passive-resistive element at all times is dissipated in its resistance as heat. The range of signals which were handled was limited. By means of this invention, a minimal current is drawn in the quiescent state, and the current required in response to large input signals is provided by the active elements. For example, a signal calling for an increased current from load-driver transistor 60 will cause a signal to be applied through Zener diode 76 to the base of current-source transistor 78. Load current can then be supplied through that transistor, through the load, to load-driver transistor 60.

It may be preferable to avoid drawing the quiescent current through the current-source transistors. In this event, a first resistor 81 may be connected between the emitter of the load-driver transistor 62 and the emitter of current-source transistor 74, and a second resistor 83 may be connected between the emitter of load-driver transistor 60 and the emitter of current-source transistor 78.

Because transistors 60 and 62 are in a linear mode of operation at all times, even though transistors 74 and 78 alternately are cut off to attain high efficiency, the effective output impedance and voltage transfer functions are dependent primarily upon the parameters of transistors 60 and 62. The load-driving transistors may also be termed emitter drivers and they are analogous to cathode followers in vacuum tubes.

FIGURE 4 shows the circuit diagram of an arrangement employing the basic circuit configuration of FIGURE 2 in a power amplifier arrangement. In this drawing, similar functioning structure will receive the same reference numerals. Thus, the load-driver transistors 60, 62 have their emitters coupled to drive the load 72, and their collectors are connected to the source of load supply potential. The base of each current-source transistor 74, 78 is respectively coupled to the emitters of the transistor 60, 62 through Zener diodes 76, 80. To provide sufficient current capacity, a second current-source transistor 94, 98 is employed in association with each one of the load current-source transistors 74, 78. These second current-source transistors 94, 98 are respectively coupled to be driven or cut off along with transistor 74, 78. The collector of transistor 94 is connected to the collector of transistor 74. The transistor 78 has its collector connected to the transistor 98 collector. The base of transistor 94 is connected to the emitter of transistor 74. The base of the transistor 98 is connected to the emitter of transistor 78. The emitter of transistor 94 is connected to ground through a resistor 82. The emitter of transistor 98 is connected to ground through a resistor 84. Resistors 82, 84 have their values selected to be less than half the load impedance, as in FIGURE 1. Resistors 100 and 106, respectively connect the base of transistors 94 and 98 to ground and function to minimize the effect of collector-base leakage current. A similar function is provided by resistors 112, 114 respectively connecting the base of transistors 74, 76 to ground.

A resistor 116 couples the emitter of transistor 62 through resistor 82 to ground. A resistor 118 couples the emitter to transistor 60 through resistor 84 to ground. By means of these resistors, transistors 60 and 62 have a current path to ground established when no signal is applied and the load current-supply transistors are cut off. It should be noted that transistors 74 and 94 are essentially connected in parallel to supply output current to the load when called for by a signal applied to Zener diode 80 to the base of transistor 74, and through its emitter to the base of transistor 94. Likewise, transistors 78, 98 have their collectors connected in parallel to supply current to the load when a signal is applied through Zener diode 76 to the base of transistor 78, and through its emitter to the base of transistor 98.

Transistors 60 and 62 are respectively driven by transistors 120, 122 using emitter-to-base coupling. The collectors of transistors 120 and 122 are connected to the load potential supply. Input signals to the arrangement are applied to the bases of transistors 120, 122. Resistors 121, 123 respectively serve the function of removing any collector-base current leakage.

The negative bias supply is derived from the negative load supply, thus reducing the power supply requirements to a single source. Dropping resistors 124, 126 are connected in series with potentiometer 66 to establish the bias potential. Rectifier 128 serves to bypass any signals in the bias circuit. Dropping resistors 130, 132 are connected in series with potentiometer 68 to establish the bias potential, and diode 134 bypasses any signals in the bias circuit. Bias potentiometers 66, 68 serve the same function as described for FIGURE 1, namely to establish the quiescent current drawn by the load driver and current supply transistors.

Due to the technique of obtaining collector voltage for the current-driver transistors, the maximum zero-to-peak signal voltages that may be switched across the load is slightly less than two-thirds of the voltage supply. This automatically reduces the available power output to 44.4 percent of the theoretical maximum. If the maximum efficiency for this configuration is computed, it can be shown that the average load power is almost five times the average transistor power dissipation per half cycle. This invention is admirably suited for driving loads, such as loudspeakers, directly and thus, by the elimination of the output transformer, enables high efficiency. In view of the common-mode operation, together with dependence only on the conductance of the load transistors, the power-supply regulation requirements are drastically reduced, and, further, a constant voltage gain from direct current to frequencies approaching the alpha cutoff of the transistors is obtained.

There has been described and shown herein a novel and useful transistor power amplifier which is operable in the AB mode and provides an efficient arrangement for directly driving low-impedance loads. Although the embodiment of the invention has been shown using a P-N-P transistor convention, it should be understood that this is not to be construed as a limitation on the invention or a restriction on the type of transistors which may be used, since such substitutions with the attendant circuit revisions are known and do not constitute a departure from the spirit or scope of the invention.

I claim:

1. A transistor amplifier for driving a load connected to a first and second load terminals from a source of signals comprising first and second load driving transistors, first and second current source transistors, and first and second bias transistors, said first and second bias transistors being of a type which is complementary to the types of said first and second load-driving and current-source transistors, all of said transistors having an emitter, a base, and a collector electrode, means connecting said first load driving transistor emitter and said first current source transistor collector to said first load terminal, means connecting said second load driving transistor emitter and said second current source transistor collector to said second load terminal, means connecting said first bias transistor emitter to said first load driving transistor collector, means connecting said first bias transistor collector to said first current source transistor base, means connecting said second bias transistor emitter to said second load driving transistor collector, means connecting said second bias transistor collector to said second current source transistor base, means to apply a bias to the bases of said first and second bias amplifiers, a first resistor in series with the collector of said first load driving transistor, a second resistor in series with the collector of said second load driving transistor, means to apply signals from said source to the bases of said first and second load driving transistors, and means for applying operating potential between said first and second resistors and the emitters of said first and second current source transistors.

2. A transistor amplifier as recited in claim 1 wherein said means to apply a bias to the bases of said first and second bias transistors includes a source of operating potential, a diode, a resistor connected in series with said diode, means connecting the bases of said first and second bias transistors between said resistor and diode, and means connecting said resistor and diode across said source of operating potential.

3. A transistor amplifier for driving a load connected to first and second load terminals from a source of signals comprising first and second load driving transistors, first and second current source transistors, and first and second bias transistors, all of said transistors having an emitter, a base, and a collector electrode, first and second bias transistors being of a type which is complementary to the type of said first and second load-driving transistors and first and second current-source transistors, means connecting said first load driving transistor emitter and said first current source transistor collector to said first load terminal, means connecting said second load driving transistor emitter and said second current source transistor collector to said second load terminal, means connecting said first bias transistor emitter to said first load driving transistor collector, means connecting said first bias transistor collector to said first current source transistor base, means connecting said second bias transistor emitter to said second load driving transistor collector, means connecting said second bias transistor collector to said second current source transistor base, means to apply a bias to the bases of said first and second bias transistors, a first resistor in series with the collector of said first load driving transistor, a second resistor in series with the collector of said second load driving transistor, a third and fourth resistor respectively connected in series with the emitters of said first current source transistor and said second current source transistor, a fifth and sixth resistor respectively connected in series with the bases of said first current source transistor and said second current source transistor, means to apply operating potential to all said transistors through said first, second, third, fourth, fifth, and sixth resistors, and means to apply signals from said source to the bases of said first and second load driving transistors.

4. A transistor amplifier for driving a load having a first and second end from a source of signals comprising four transistors each having a collector, emitter and base electrode, means respectively coupling the emitter of a first of said transistors to the collector of a second of said transistors and to said first end of said load, means respectively coupling the emitter of a third of said transistors to the collector of a fourth of said transistors and to said second end of said load, means for establishing a quiescent current for said first and second transistors, said means including a first resistor in series with said first transistor collector, a fifth transistor having collector, emitter and base electrodes, and, said fifth transistor being of a type which is complementary to the types of said first and second transistors, and means for coupling said fifth transistor between said first transistor collector and said second transistor base to establish current flow to said second transistor responsive to the potential of said first transistor collector including means connecting said fifth transistor emitter to said first transistor collector, means connecting said fifth transistor collector to said second transistor base, bias means, and means for connecting said fifth transistor base to said bias means, means for establishing a quiescent current for said third and fourth transistors, said means including a second resistor in series with said third transistor collector, a sixth transistor, said sixth transistor having collector, emitter and base electrodes, and being of a type which is complementary to the types of said third and fourth transistors, and means for coupling said sixth transistor between said third transistor collector and said fourth transistor base to establish current flow through said fourth transistor responsive to the potential of said third transistor collector including means connecting said sixth transistor emitter to said third transistor collector, means connecting said sixth transistor collector to said fourth transistor base, and means connecting said sixth transistor base to said bias means, means for applying operating potential across said first and second resistors and the emitters of said second and fourth transistors, and means to apply signals from said source to the bases of said first and third transistors.

References Cited in the file of this patent

UNITED STATES PATENTS

| | | |
|---|---|---|
| 2,428,295 | Scantlebury | Sept. 30, 1947 |
| 2,561,425 | Stachura | July 24, 1951 |
| 2,590,104 | King | Mar. 25, 1952 |
| 3,005,915 | White et al. | Oct. 24, 1961 |